United States Patent
He et al.

(10) Patent No.: US 8,673,707 B2
(45) Date of Patent: Mar. 18, 2014

(54) METHOD FOR FORMING METAL GATE

(75) Inventors: Qiyang He, Shanghai (CN); Yiying Zhang, Shanghai (CN)

(73) Assignee: Semiconductor Manufacturing International (Shanghai) Corporation, Shanghai (CN)

(*) Notice: Subject to any disclaimer, the term of this patent is extended or adjusted under 35 U.S.C. 154(b) by 343 days.

(21) Appl. No.: 13/198,645

(22) Filed: Aug. 4, 2011

(65) Prior Publication Data

US 2012/0171854 A1 Jul. 5, 2012

(30) Foreign Application Priority Data

Dec. 29, 2010 (CN) .......................... 2010 1 0612985

(51) Int. Cl.
*H01L 21/338* (2006.01)

(52) U.S. Cl.
USPC ........... 438/183; 438/184; 438/320; 438/303; 257/618

(58) Field of Classification Search
USPC ......... 438/180, 183, 184, 229, 230, 299, 303; 257/396, 401, 618
See application file for complete search history.

(56) References Cited

U.S. PATENT DOCUMENTS

2010/0109088 A1 5/2010 Ng et al.
2012/0032239 A1* 2/2012 Huang et al. ............... 257/288

* cited by examiner

*Primary Examiner* — Hsien Ming Lee
(74) *Attorney, Agent, or Firm* — Anova Law Group, PLLC (57) ABSTRACT

A method for forming a metal gate includes providing a substrate, subsequently forming a dummy gate on the substrate, forming spacers on sidewalls of the dummy gate, forming a stop layer on the substrate, the dummy gate and spacers of the dummy gate, and forming a sacrificial dielectric layer on the dummy gate and the stop layer. The method further includes removing a part of the sacrificial dielectric layer and the stop layer until the dummy gate is exposed and, removing a residual sacrificial dielectric layer, depositing an interlayer dielectric layer on the dummy gate and the stop layer, polishing the interlayer dielectric layer until the dummy gate is exposed, removing the dummy gate to form a trench, and forming a metal gate in the trench. The interlayer dielectric layer is flat and substantially flush with the dummy gate, so that no recesses are formed thereon.

17 Claims, 8 Drawing Sheets

METHOD FOR FORMING METAL GATE

CROSS-REFERENCES TO RELATED APPLICATIONS

The present application claims the priority of Chinese Patent Application No. 201010612985.5, entitled "METHOD FOR FORMING METAL GATE", and filed Dec. 29, 2010, the entire disclosure of which is incorporated herein by reference.

BACKGROUND OF THE INVENTION

1. Field of the Invention

The present invention generally relates to the field of semiconductor manufacture, and particularly to a method for forming a metal gate.

2. Description of Prior Art

In the wake of an ever increasing integration level of semiconductor devices, a mainstream method for fabricating MOS transistor of a semiconductor device generally includes a gate dielectric layer having a high k material which has a dielectric constant of larger than or equal to ten, and a gate having metal material. In a method for forming a metal gate on a high k gate dielectric layer, an interlayer dielectric layer is typically polished by a chemical mechanical polishing (CMP) process before removing a polysilicon dummy gate. The CMP process of the interlayer dielectric layer is important for performance of the metal gate formed in subsequent steps. A conventional method for forming a metal gate is disclosed in, for example US Patent Publication No. 20100109088.

FIGS. 1-5 exemplarily show a conventional method for forming a metal gate.

Figure 1:
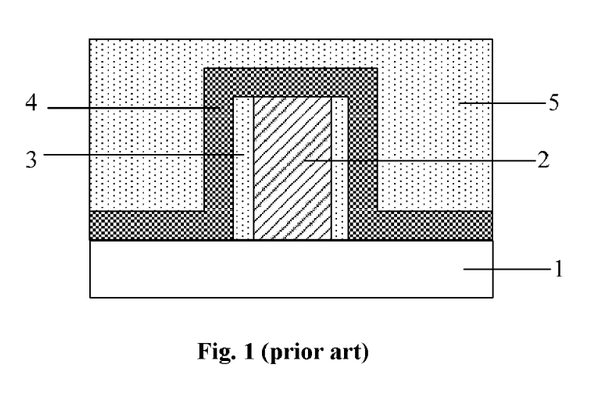
FIGS. 1-5 are cross-sectional views of intermediate structures of a metal gate, illustrating a conventional method for forming the metal gate.

As shown in FIG. 1, a transistor comprises a substrate 1 and a dummy gate 2 formed on a substrate 1. The dummy gate 2 is formed of polysilicon. Silicon oxide spacers 3 are formed on sidewalls of the dummy gate 2. A silicon nitride stop layer 4 and an interlayer dielectric layer 5 are respectively formed on the substrate 1 and cover the dummy gate 2 and the silicon oxide spacers 3. A drain/source region (not shown) may be formed on the substrate 1 and opposite sides of the dummy gate 2.

Figure 2:
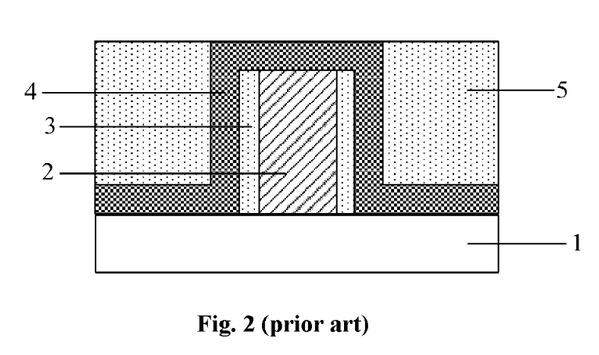

As shown in FIG. 2, the interlayer dielectric layer 5 is polished by a CMP process until the silicon nitride stop layer 4 on the dummy gate 2 is exposed.

Figure 3:
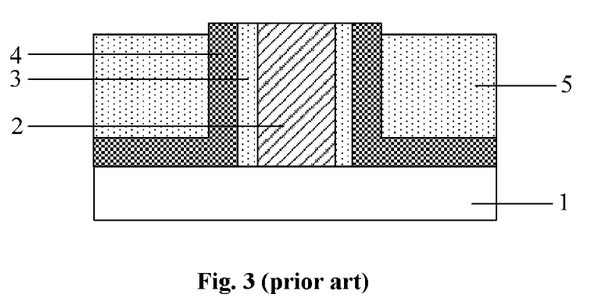

As shown in FIG. 3, the silicon nitride stop layer 4 and the interlayer dielectric layer 5 are further polished by a CMP process until the dummy gate 2 is exposed. The silicon nitride stop layer 4 is subject to shape of the silicon oxide spacers 3, and has removal rate different from that of the silicon oxide, slurry used in the CMP process is remained on the silicon nitride stop layer 4 for a short time. Instead, most of the slurry is remained on the interlayer dielectric layer 5 close to the silicon nitride stop layer 4. Removal rate of the interlayer dielectric layer 5 close to the silicon nitride stop layer 4 is different from removal rate of the interlayer dielectric layer 5 far away from the silicon nitride stop layer 4. As a result, when the dummy gate 2 is exposed and is in flush with the silicon nitride stop layer 4, the interlayer dielectric layer 5 close to the silicon nitride stop layer 4 is lower than the dummy gate 2 and the silicon nitride stop layer 4. Recesses may be formed between adjacent dummy gates 2.

Figure 4:
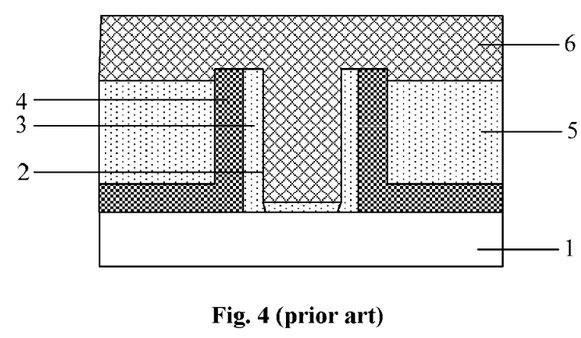

As shown in FIG. 4, the dummy gate 2 is removed to expose the substrate 1 for forming a trench (not labeled) between the silicon oxide spacers 3. A high k dielectric layer (not labeled) is formed in the trench. A metal layer 6 is deposited and filled the trench to cover the high k dielectric layer and the interlayer dielectric layer 5.

Figure 5:
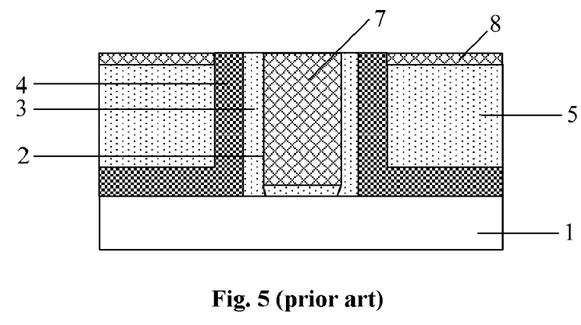

Referring to FIG. 5, the metal layer 6 is polished by a CMP process to expose the interlayer dielectric layer 5 for forming a metal gate 7. Due to recesses between adjacent dummy gates 2, metal residuals 8 may be remained on the interlayer dielectric layer 5, causing a deterioration of electrical performance.

BRIEF SUMMARY OF THE INVENTION

Embodiments of the present invention provide a method for forming a metal gate of a semiconductor device that does not leave metal residuals on the interlayer dielectric layer, so that a performance deterioration can be avoided and the reliability of the semiconductor device can be improved.

In one embodiment, a method for forming a metal gate comprises:

providing a substrate, forming a dummy gate on the substrate, forming spacers on sidewalls of the dummy gate;

forming a stop layer on the substrate, the dummy gate and the spacers;

forming a sacrificial dielectric layer on the stop layer;

removing a part of the sacrificial dielectric layer and a top surface of the stop layer until the dummy gate is exposed and the sacrificial dielectric layer and the stop layer are lower than the dummy gate;

removing residual sacrificial dielectric layer;

depositing an interlayer dielectric layer on the stop layer and the dummy gate;

polishing the interlayer dielectric layer until the dummy gate is exposed, the interlayer dielectric layer being substantially flush with the dummy gate;

removing the dummy gate to form a trench; and forming a metal gate in the trench.

Optionally, the stop layer comprises silicon nitride and is formed by a chemical vapor deposition process.

Optionally, the sacrificial dielectric layer comprises an organic anti-reflective material and is formed by a spinning process.

Optionally, removing a part of the sacrificial dielectric layer and a top surface of the stop layer until the dummy gate is exposed, comprises: etching the part of the sacrificial dielectric layer by a first selective plasma etch process until the stop layer is exposed; and etching the stop layer by a second selective plasma etch process until the dummy gate is exposed.

Optionally, the first selective plasma etch process comprises a selective etch ratio of the sacrificial dielectric layer relative to the stop layer greater than ten.

Optionally, the first selective plasma etch process comprises an etching gas comprising oxygen.

Optionally, the dummy gate comprises polysilicon.

Optionally, the second selective plasma etch process comprises a selective etch ratio of the stop layer relative to the dummy gate greater than ten.

Optionally, the second selective plasma etch process comprises an etching gas comprising $CH_2F_2$, $CH_3F$, or a combination thereof.

Optionally, the sacrificial dielectric layer is removed by ashing, and is rinsed with a chemical solution.

Optionally, depositing the interlayer dielectric layer on the stop layer and the dummy gate comprises: forming a first silicon oxide dielectric layer on the stop layer and the dummy gate by a high aspect ratio filling process; and forming a second silicon oxide dielectric layer on the first silicon oxide dielectric layer by a TEOS process, the first silicon oxide dielectric layer and the second silicon oxide dielectric layer form the interlayer dielectric layer.

Optionally, the dummy gate can be removed by wet etching, dry etching, or a combination thereof.

Optionally, forming the metal gate in the trench comprises: forming a gate dielectric layer in a bottom of the trench and on the substrate; depositing a metal layer on the interlayer dielectric layer, the metal layer being filled in the trench; and polishing the metal layer by a CMP process until the interlayer dielectric layer exposed.

Optionally, the gate dielectric layer comprises a high k material.

Optionally, the high k material of the gate dielectric layer is selected from the group consisting of HfSiO, HfZrO, HfLaO, $HfO_2$, or a combination thereof.

Optionally, material of the metal layer is selected from the group consisting of aluminum, copper, nickel, chromium, tungsten, titanium, titanium tungsten, tantalum, platinum nickel, or a combination thereof, and can be formed by a physical vapor deposition process.

Compared with the prior art, the technical solutions provided by the present invention have the following advantages.

Before the interlayer dielectric layer is deposited on the stop layer, the sacrificial dielectric layer is etched by the first selective plasma etch process until the stop layer is exposed and the sacrificial dielectric layer is lower than the stop layer. The stop layer is etched by the second selective plasma etch process until the top of the dummy gate and upper portions of the silicon oxide spacers are exposed. The stop layer is lower than the dummy gate, and therefore will not be etched when the interlayer dielectric layer is etched by a CMP process.

When the interlayer dielectric layer including silicon oxide is etched by the CMP process, the stop layer including silicon nitride is not polished, and the polysilicon dummy gate acts as a stop indication layer of this CMP process. The polished interlayer dielectric layer is thus flat, and is substantially flush with the polysilicon dummy gate. As a result, the interlayer dielectric layer has a substantially flat surface after the CMP process. No recesses are formed in the interlayer dielectric layer. Accordingly, no metal residues will remain on the interlayer dielectric layer, effectively eliminate any potential electrical shorts, so that electrical performance and reliability can be improved.

DETAILED DESCRIPTION OF THE INVENTION

In the conventional method for forming a metal gate that, when a chemical mechanical polishing (CMP) process is performed on an interlayer dielectric layer, silicon oxide, polysilicon and silicon nitride are all polished at the same time. These materials are of different compositions, so that they face different removal rates of the slurry. Therefore, it is difficult to polish the interlayer dielectric layer to be flush with the polysilicon gate. After polishing, the interlayer dielectric layer is generally lower than the stop layer and the polysilicon gate, and metal residues may remain on the interlayer dielectric layer. Moreover, recesses may form on the interlayer dielectric layer, and metal residues may remain therein after a deposition and polishing of a metal layer for forming a metal gate. Electrical shorts or metal bridging may occur. After extensive experimentations and researches, the present invention provides a solution to overcome these problems.

Figure 6:
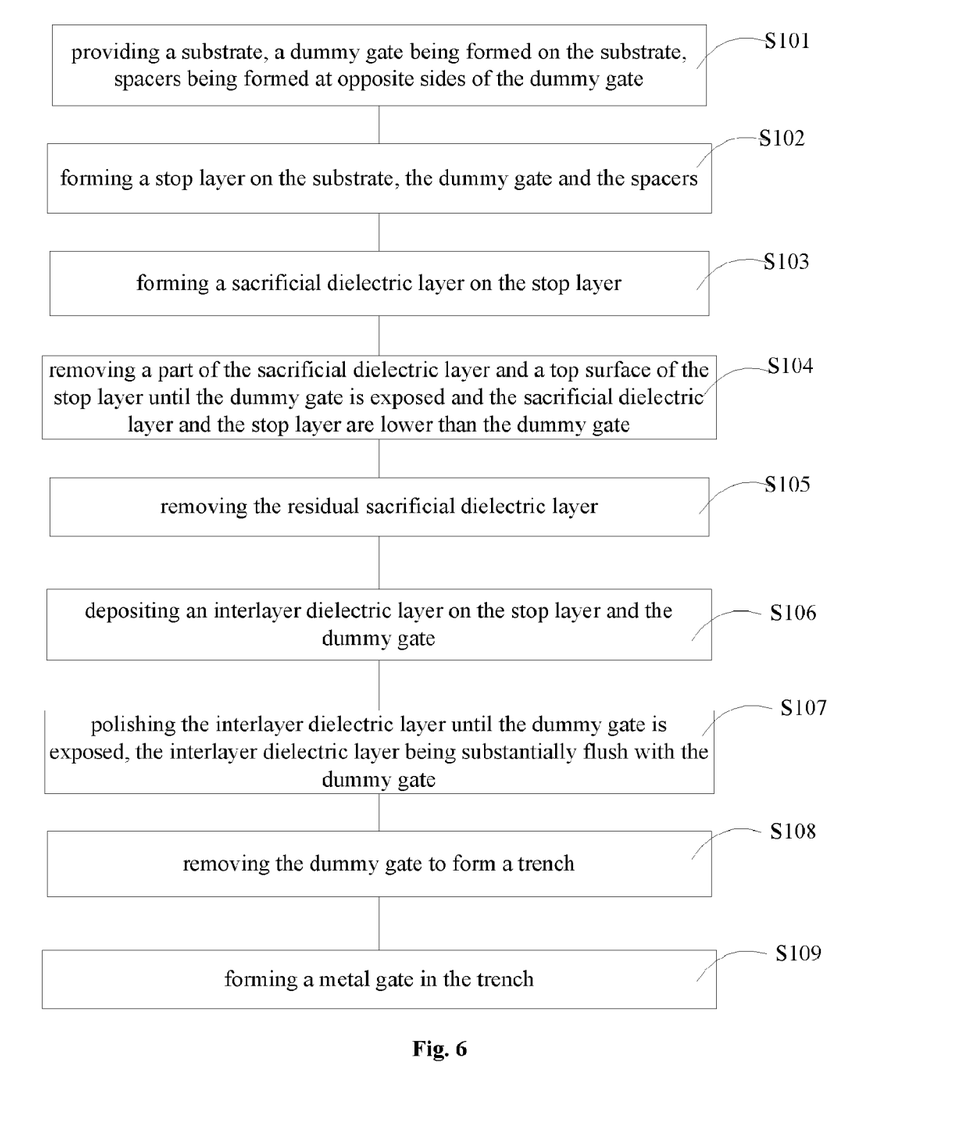
FIG. 6 is a flow chart of a method for forming a metal gate according to an embodiment of the present invention.

FIG. 6 is a flow chart of a method for forming a MOS transistor according to an embodiment of the present invention.

Referring to FIG. 6, in step S101, a substrate is provided. A dummy gate is formed on the substrate, and spacers are formed on sidewalls of the dummy gate.

In an embodiment, the substrate may be formed with monocrystalline silicon, polysilicon or silicon on insulator. The dummy gate includes a polysilicon gate electrode. Optionally, the dummy gate can be formed directly over a gate dielectric layer. In subsequent steps, the polysilicon gate electrode will be replaced with a metal gate electrode. It should be noted that the gate dielectric layer comprises normal gate dielectric material, such as silicon oxide. Alternatively, the gate dielectric layer may include a high k material, and is formed after removing the dummy gate in order to avoid undue etching. In this case, the dummy gate does not include a gate dielectric layer.

The spacers are formed with polysilicon. In an example embodiment, a method for forming the spacers comprises: depositing a silicon oxide layer on the dummy gate, and etching the silicon oxide by an anisotropic plasma etching process to obtain silicon oxide spacers on sidewalls of the dummy gate.

Optionally, a source region and a drain region are formed in the substrate and at each side of the dummy gate by an ion doping process for forming a MOS transistor.

In step S102, a stop layer is formed on the substrate, the dummy gate, and the spacers.

In an embodiment, the stop layer comprises silicon nitride for guarding the MOS transistor, and may function as a stop layer and a stress layer for forming contact holes that connect with the source region of the MOS transistor. The stop layer on the sidewalls of the dummy gate and the silicon oxide spacers constitute together composite spacers.

In step S103, a sacrificial dielectric layer is formed on the stop layer.

In the first embodiment, the sacrificial dielectric layer has reliable adhesion and is suitable for selective etching and removal. As an example, the sacrificial dielectric layer comprises an organic anti-reflective material and is formed on the stop layer by spinning In step S104, a part of the sacrificial dielectric layer and a top surface of the stop layer are removed to expose the dummy gate. In this way, the sacrificial dielectric layer and the stop layer are lower than the dummy gate. Specifically, the top surface of the stop layer comprises the stop layer on a top of the dummy gate, and the stop layer on upper portions of the spacers.

In an embodiment, the part of the sacrificial dielectric layer and the stop layer are removed in two steps. In a first step, the part of the sacrificial dielectric layer is etched by a first selective plasma etch process until the stop layer is exposed. In a second step, the stop layer is etched by a second selective plasma etch process until the dummy gate is exposed. The sacrificial dielectric layer and the stop layer are both lower than the dummy gate.

In step S105, residual sacrificial dielectric layer is removed.

In the first embodiment, the sacrificial dielectric layer is removed by ashing, and is cleaned with an acidic solution for protecting other portions.

In step S106, an interlayer dielectric layer is deposited on the stop layer and the dummy gate.

In an embodiment, the interlayer dielectric layer comprises silicon oxide. The interlayer dielectric layer may be directly formed on the stop layer and the dummy gate by a chemical vapor deposition. Alternatively, the interlayer dielectric layer may be formed by a High Aspect Ratio Process (HARP) or a TEOS process for improving adhesion between the interlayer dielectric layer and other structure under the interlayer dielectric layer, thereby prevent void and recess from forming.

In step S107, the interlayer dielectric layer is polished until the top of the dummy gate is exposed.

In an embodiment, the interlayer dielectric layer is polished by a chemical mechanical polishing process, with the dummy gate acting as a stop layer. The top surface of the stop layer is removed so that the stop layer is lower than the dummy gate. Thus, the stop layer is not polished, and only the interlayer dielectric layer is polished. In this way, an even surface of the interlayer dielectric layer can be achieved. The interlayer dielectric layer is substantially flush with the dummy gate without recesses therein.

In step S108, the dummy gate is removed for forming a trench.

In an embodiment, the polysilicon dummy gate is removed by wet etching, dry etching, or a combination thereof. A surface of the substrate is exposed in the trench. Alternatively, the gate dielectric layer is exposed in the trench when a gate dielectric layer is formed in the step S101.

In step S109, a metal gate is formed in the trench.

In an embodiment, the gate dielectric layer is exposed in the trench. A metal material is filled directly in the trench for forming a metal gate. In an alternative embodiment, the substrate is exposed in the trench. A high k gate dielectric layer is formed on the substrate, and the metal material is filled in the trench and on the high k gate dielectric layer for forming the metal gate.

More specifically, a metal layer is deposited on the interlayer dielectric layer and is filled in the trench by a physical vapor deposition. Then the metal layer is polished by a chemical mechanical polishing process to expose the interlayer dielectric layer for forming a metal gate in the trench.

The metal layer can be deposited on the interlayer dielectric layer by physical vapor deposition. The metal layer is filled in the trench, and is polished by a chemical mechanical polishing process until the interlayer dielectric layer is exposed. The metal layer in the trench forms the metal gate.

In this process, the interlayer dielectric layer is flat without recesses being formed therein. There is no metal remained on the interlayer dielectric layer after CMP. Thus, electric performance and reliability are improved.

In order to clarify the features, characteristics and advantages of the invention, embodiments of the invention will be shown in detail in combination with accompanied drawings. More examples are provided hereinafter to describe the embodiments of the invention. However, it shall be appreciated by those skilled in the art that alternative ways may be made without deviation from the scope of the invention. Therefore, the invention is not limited within the embodiments described here.

FIGS. 7-20 illustrate a method for forming a CMOS device with a metal gate according to an embodiment of the present invention. The CMOS device may include a NMOS transistor and a PMOS transistor.

Figure 7:
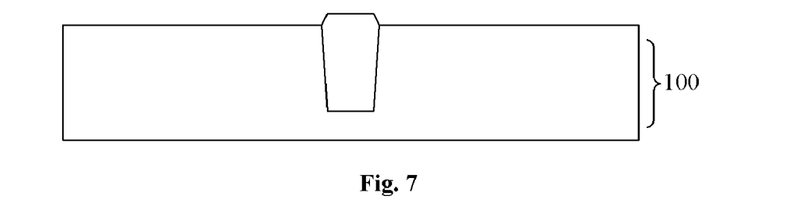
FIGS. 7-20 are cross-sectional views of intermediate structures of a metal gate, illustrating a method for forming a metal gate according to an embodiment of the present invention.

As shown in FIG. 7, a substrate 100 is provided. In an embodiment, the substrate 100 comprises monocrystalline silicon, and may be doped with P-type ions to form a P-type well (not shown) of a CMOS device. Shallow trench isolations are defined in the substrate 100 for isolating the NMOS transistor and the PMOS transistor, which is well known in the art.

Figure 8:
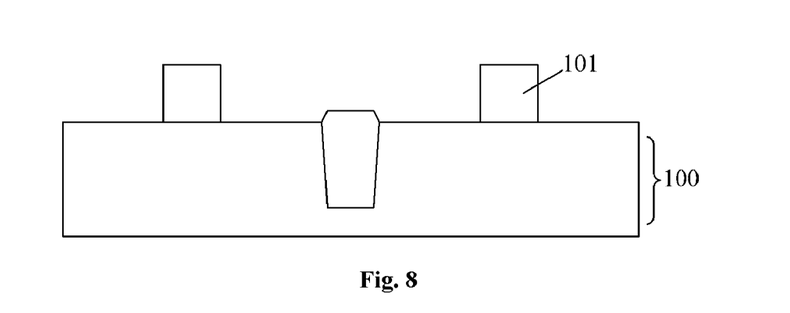

As shown in FIG. 8, a polysilicon layer is formed on the substrate 100, and is etched for forming a dummy gate 101.

In an embodiment, the polysilicon layer is formed by a furnace deposition process. The deposited thickness of the polysilicon layer determines a thickness of the dummy gate 101, and thus thickness of the metal gate. Photoresist is patterned on the polysilicon layer for defining a location of the dummy gate 101. Using the photoresist as a mask, the polysilicon layer is etched by a plasma etch process to expose the substrate 100 for forming the dummy gate 101. The photoresist is then removed.

Figure 9:
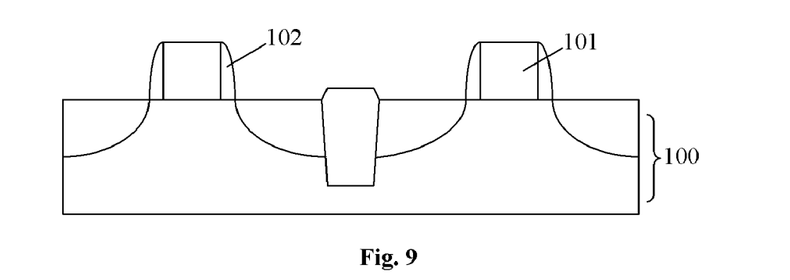

As shown in FIG. 9, a silicon oxide layer is deposited on the dummy gate 101, and is etched by an anisotropic plasma etch process for forming silicon oxide spacers 102 on sidewalls of the dummy gate 101. In order to form a MOS transistor, ions are doped at each side of the dummy gate 101 and in the substrate 100 for forming a source region and a drain region.

Figure 10:
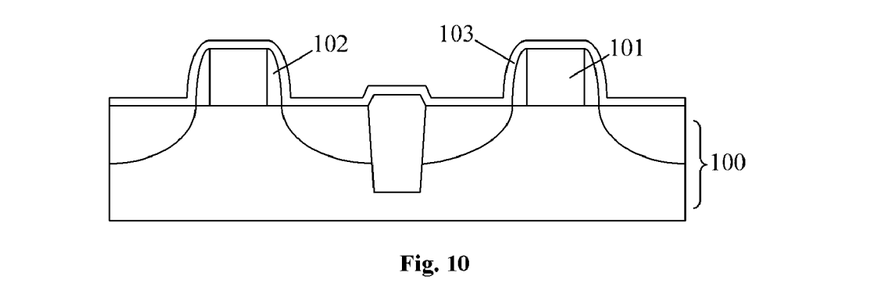

Referring to FIG. 10, a stop layer 103 is formed on the substrate 100, the dummy gate 101 and the silicon oxide spacers 102. The stop layer 103 may protect other portions, and may act as an etch stop layer in subsequent process of forming active region contact holes. The stop layer 103 has a material that is different from the material of the other portions, such as the interlayer dielectric layer, the dummy gate 101 and the silicon oxide spacers 102. In an example embodiment, the stop layer 103 comprises silicon nitride, and is formed by a chemical vapor deposition.

Figure 11:
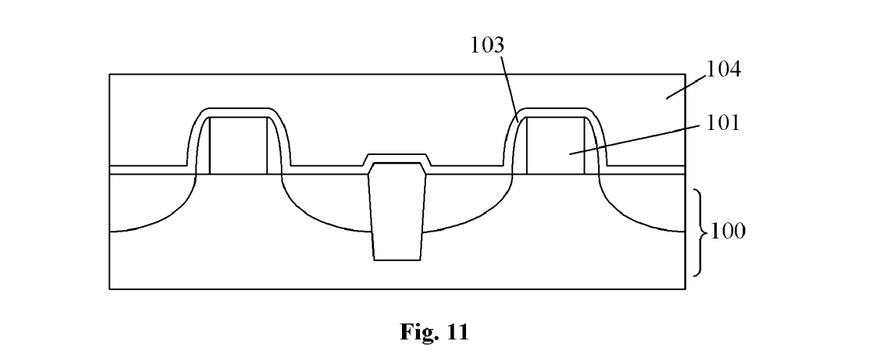

As shown in FIG. 11, a sacrificial dielectric layer 104 is formed on the stop layer 103 covering the dummy gate 101 and the stop layer 103. The sacrificial dielectric layer 104 is higher than the dummy gate 101. The sacrificial dielectric layer 104 provides reliable adhesion to the stop layer and can be easily and selectively etched and removed. In an example embodiment, the stop layer 103 comprises an organic anti-reflective material and may be formed by a spinning process.

Figure 12:
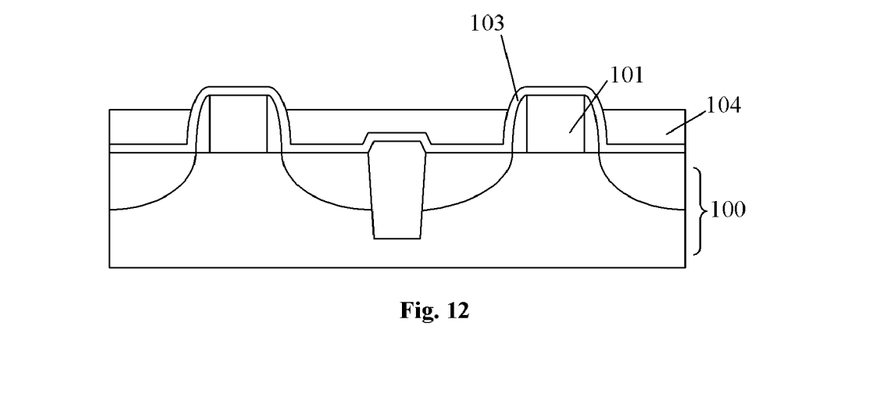

As shown in FIG. 12, the sacrificial dielectric layer 104 is etched by a first selective plasma etch process to be lower than the stop layer 103 so that a part of the stop layer 103 on the dummy gate 101 and the spacers 102 are exposed.

In an embodiment, the stop layer 103 comprises silicon nitride, while the sacrificial dielectric layer 104 comprises an organic anti-reflective material. Due to the different physical characteristics of the materials, the sacrificial dielectric layer 104 may be selectively etched in a plasma etch process. In comparison with silicon nitride formed by a chemical vapor deposition process, the organic anti-reflective material is more porous and very soft. In the first selective plasma etch process, etching gas mainly comprises oxygen, so that a selective etch ratio between the sacrificial dielectric layer 104 and the stop layer 103 is greater than ten.

Figure 13:
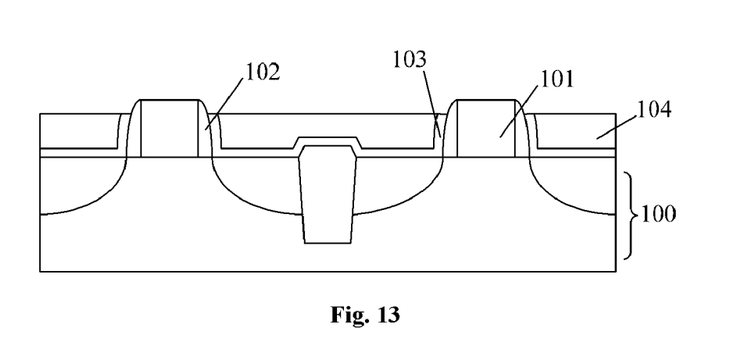

As shown in FIG. 13, the stop layer 103 is etched by a second selective plasma etch process, so that a top portion of the dummy gate 101 and upper portions of the silicon oxide spacers 102 are exposed.

In an embodiment, the dummy gate 101 comprises polysilicon, and the spacers 102 comprise silicon oxide. The stop layer 103 comprises silicon nitride. According to different chemical characteristics of the stop layer 103 from the dummy gate 101 and the silicon oxide spacers 102, the stop layer 103 may be selectively etched based on chemical corrosion effect of plasma etch process. In the second selective plasma etch process, etching gas mainly comprises gas containing F and C, for example at least one of $CH_2F_2$ and $CH_3F$. The selective etch ratio of the stop layer 103 relative to the dummy gate 101 is greater than ten. The sacrificial dielectric layer 104 is also etched in the second selective plasma etch process, which is acceptable because the sacrificial dielectric layer 104 may be removed in subsequent steps. However, a certain thickness of the sacrificial dielectric layer 104 must remain to prevent the stop layer 103 disposed between the sacrificial dielectric layer 104 and the substrate 100 from being removed.

Figure 14:
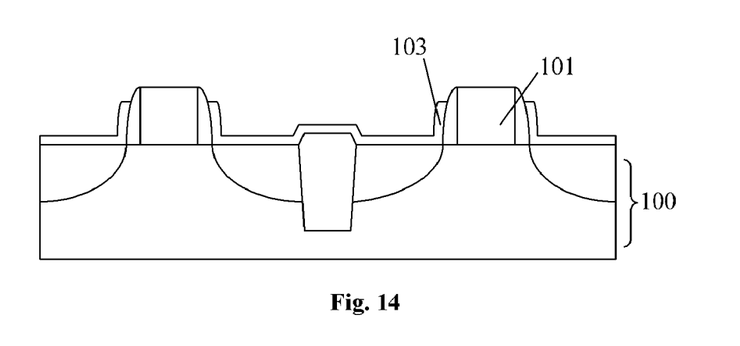

As shown in FIG. 14, the sacrificial dielectric layer 14 is removed. In an embodiment, the sacrificial dielectric layer 14 may include a porous organic anti-reflective material. The sacrificial dielectric layer 14 is removed by ashing, and is rinsed with a chemical solution.

Figure 15:
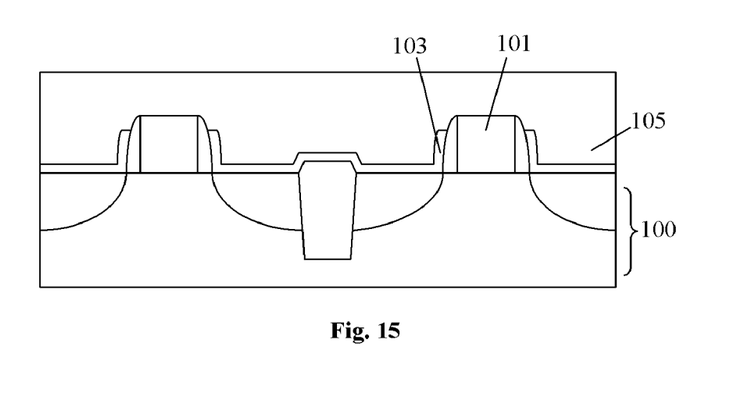

As shown in FIG. 15, an interlayer dielectric layer 105 is deposited on the stop layer 13, the dummy gate 101, and the silicon oxide spacers 102. The interlayer dielectric layer 105 may include silicon oxide using a multi-step deposition process.

In an embodiment, a first silicon oxide dielectric layer is formed by a high aspect ratio filling process. The CMOS device typically has a complicated profile, and may include a plurality of dummy gates 101, shallow trench isolations having different heights. Spacing between the dummy gates 101 and the aspect ratio may also be different. Silicon oxide can be directly deposited by a chemical vapor deposition process. Imperfections such as voids or recesses, tend to occur on the substrate 100. The high aspect ratio filling process may facilitate adhesion of the first silicon oxide dielectric layer. Then a second silicon oxide dielectric layer is formed by a TEOS process. The first silicon oxide dielectric layer and the second silicon oxide dielectric layer form together the interlayer dielectric layer 105.

Figure 16:
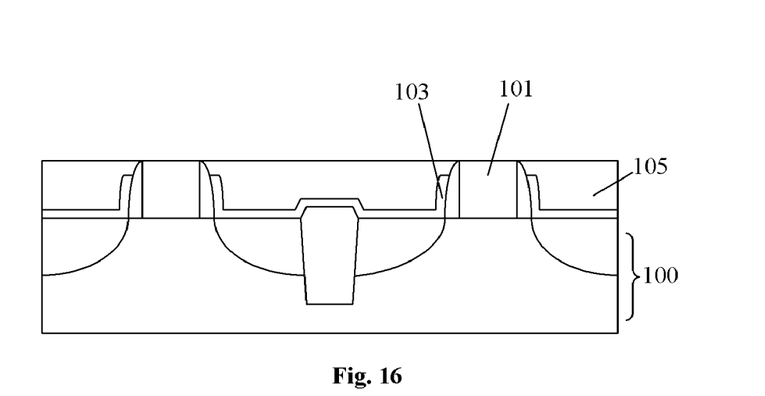

As shown in FIG. 16, the interlayer dielectric layer 105 is polished by a CMP process until the dummy gate 101 is exposed. The stop layer 103 is lower than the dummy gate 101, and is not removed in the CMP process. Because the interlayer dielectric layer 105 comprises silicon oxide and the dummy gate 101 comprises polysilicon, a slurry having a low removal rate on the polysilicon can be used so that the CMP process is stopped on the dummy gate 101. After the CMP process, the interlayer dielectric layer 105 is substantially flush with the dummy gate 101. The dummy gate 101 and the interlayer dielectric layer 105 are substantially flat, and no recesses are formed in the dummy gate 101 and the interlayer dielectric layer 105.

Figure 17:
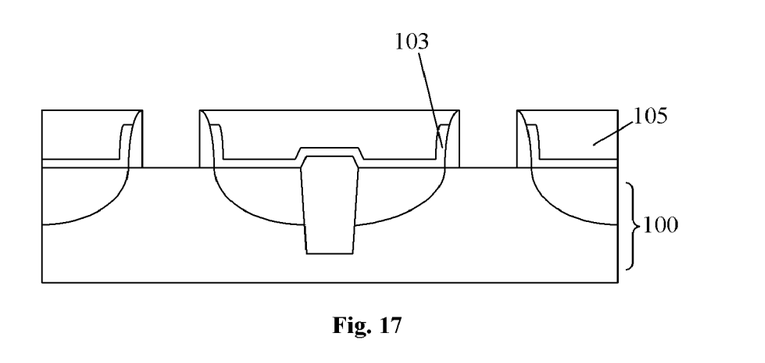

As shown in FIG. 17, the dummy gate 101 is removed to form a trench. In an embodiment, the dummy gate 101 is removed by a wet etch process, and can be etched with an alkaline solution such as ammonia water, or an acidic solution such as nitric acid or sulphuric acid. It should be noted that the solution has weak corrosive characteristics on the monocrystalline substrate 100, the silicon oxide spacers 102 and the interlayer dielectric layer 105. A surface of the substrate 100 is exposed in the trench after removal of the dummy gate 101.

Figure 18:
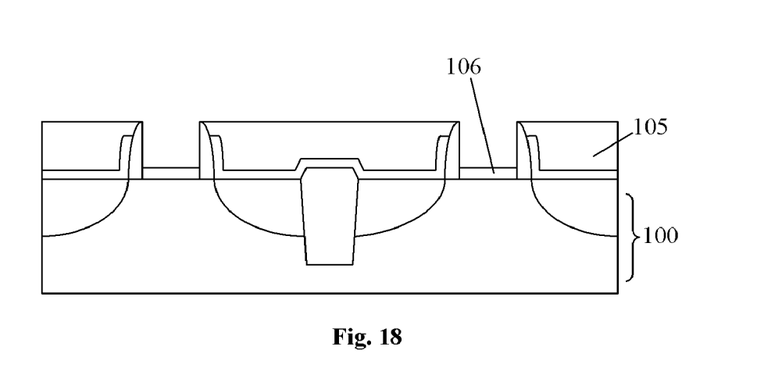

As shown in FIG. 18, a gate dielectric layer 106 is formed in the trench and on the exposed surface of the substrate 100. The gate dielectric layer 106 can be formed with high k material which is selected from HfSiO, HfZrO, HfLaO, $HfO_2$ or any combination thereof. The gate dielectric layer 106 can be formed by LPCVD, PECVD or the like.

Figure 19:
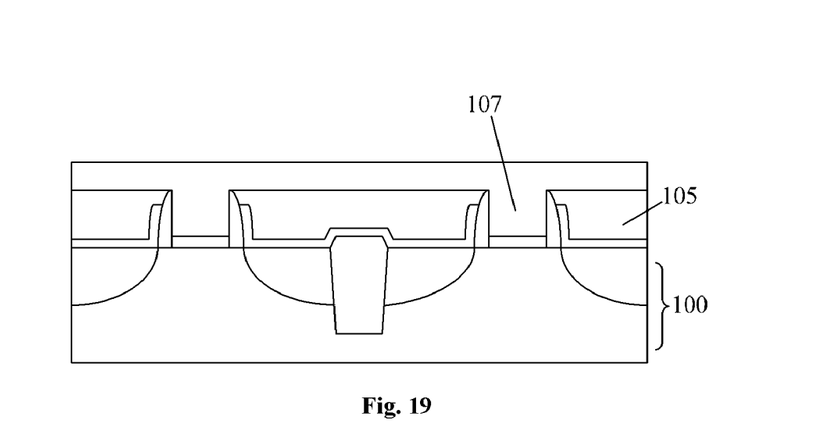

As shown in FIG. 19, a metal layer 107 is deposited on the interlayer dielectric layer 105 and in the trench. Material of the metal layer 107 can be selected from aluminum, copper, nickel, chromium, tungsten, titanium, titanium tungsten, tantalum, platinum nickel or any combination thereof. In an example embodiment, the metal layer 107 is formed by physical vapor deposition.

Figure 20:
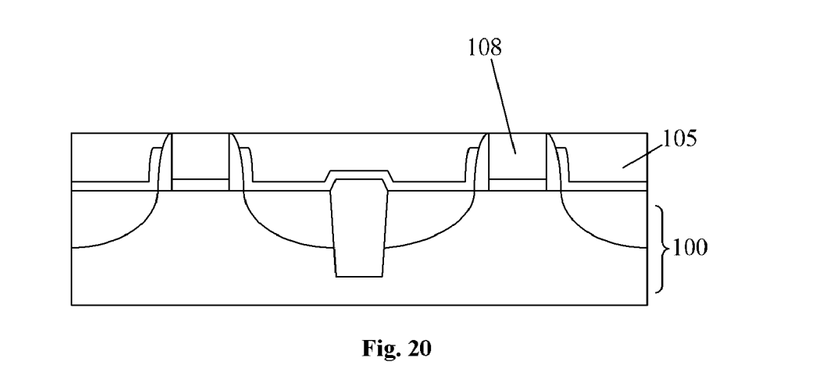

As shown in FIG. 20, the metal layer 107 is polished by a CMP process until the interlayer dielectric layer 105 is exposed. The metal layer 107 that is left in the trench forms a metal electrode 108. The metal electrode 108 and the gate dielectric layer 106 forms a metal gate.

The interlayer dielectric layer 105 is flat, and no recesses are formed in the interlayer dielectric layer 105. The interlayer dielectric layer 105 is substantially flush with the dummy gate 101. No metal residues are remained on the interlayer dielectric layer 105, effectively eliminating shorts that may be caused by metal residues, so that electrical performance and reliability can be improved.

The invention is disclosed, but not limited, by preferred embodiment as above. Based on the disclosure of the invention, those skilled in the art could make any variation and modification without deviation from the scope of the invention. Therefore, any modification, variation and polishing based on the embodiments described herein belongs to the scope of the invention.

What is claimed is:

1. A method for forming a metal gate, comprising:
providing a substrate;
forming a dummy gate on the substrate;
forming spacers on sidewalls of the dummy gate;
forming a stop layer on the substrate, the dummy gate and the spacers;
forming a sacrificial dielectric layer on the stop layer;
removing a part of the sacrificial dielectric layer and a top surface of the stop layer until the dummy gate is exposed, the sacrificial dielectric layer and the stop layer being lower than the dummy gate after the removing;
removing a residual sacrificial dielectric layer;
depositing an interlayer dielectric layer on the stop layer and the dummy gate after the removing the part of the sacrificial dielectric layer and the top surface of the stop layer;
polishing the interlayer dielectric layer until the dummy gate is exposed, the interlayer dielectric layer being substantially flush with the dummy gate;
removing the dummy gate to form a trench; and
forming a metal gate in the trench.

2. The method according to claim 1, wherein the stop layer comprises silicon nitride and is formed by a chemical vapor deposition process.

3. The method according to claim 1, wherein the sacrificial dielectric layer comprises an organic anti-reflective material and is formed by a spinning process.

4. The method according to claim 3, wherein the sacrificial dielectric layer is removed by an ashing process and is cleaned with a chemical solution.

5. The method according to claim 1, wherein removing a part of the sacrificial dielectric layer and a top surface of the stop layer until the dummy gate is exposed, comprises: etching the part of the sacrificial dielectric layer by a first selective plasma etch process until the stop layer is exposed; and etching the stop layer by a second selective plasma etch process until the dummy gate is exposed.

6. The method according to claim 5, wherein the first selective plasma etch process comprises a selective etch ratio between the sacrificial dielectric layer and the stop layer greater than ten.

7. The method according to claim 6, wherein the first selective plasma etch process comprises an etching gas comprising oxygen.

8. The method according to claim 5, wherein the second selective plasma etch process comprises a selective etch ratio between the stop layer and the dummy gate greater than ten.

9. The method according to claim 5, wherein the second selective plasma etch process comprises an etching gas comprising $CH_2F_2$, $CH_3F$ or a combination thereof.

10. The method according to claim 1, wherein the dummy gate comprises polysilicon.

11. The method according to claim 1, wherein depositing the interlayer dielectric layer on the stop layer and the dummy gate comprises:
   forming a first silicon oxide dielectric layer on the stop layer and the dummy gate by a high aspect ratio filling process; and
   forming a second silicon oxide dielectric layer on the first silicon oxide dielectric layer by a TEOS process.

12. The method according to claim 1, wherein the dummy gate is removed by wet etching, dry etching or a combination thereof.

13. The method according to claim 1, wherein forming the metal gate in the trench comprises: forming a gate dielectric layer on a bottom of the trench and on the substrate; depositing a metal layer on the interlayer dielectric layer and filling the trench; and polishing the metal layer by a CMP process until the interlayer dielectric layer is exposed.

14. The method according to claim 13, wherein the gate dielectric layer comprises a high k material.

15. The method according to claim 14, wherein the high k material of the gate dielectric layer comprises HfSiO, HfZrO, HfLaO, $HfO_2$ or a combination thereof.

16. The method according to claim 13, wherein the metal layer comprises a material selected from the group consisting of aluminum, copper, nickel, chromium, tungsten, titanium, titanium tungsten, tantalum, platinum nickel or a combination thereof.

17. The method according to claim 13, wherein depositing the metal layer comprises a physical vapor deposition process.

* * * * *